July 4, 1961
B. DANKER
2,991,359
RADIO RECEIVING ARRANGEMENT
Filed Sept. 22, 1958
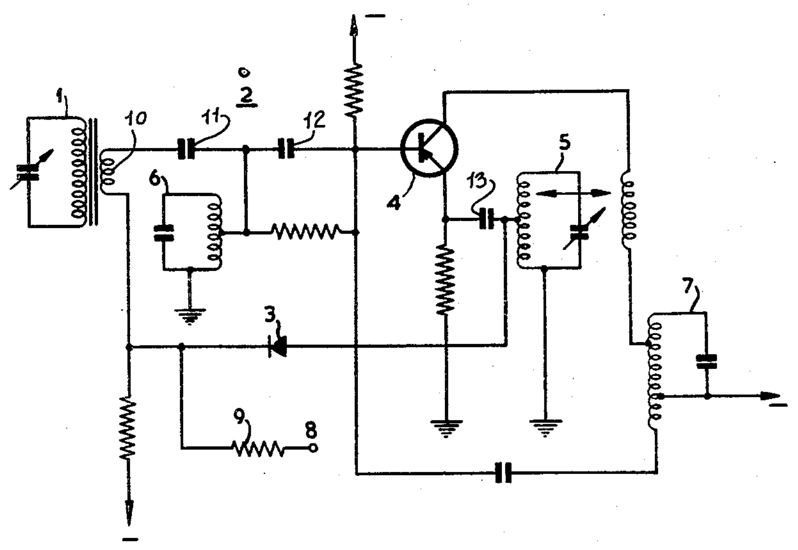
INVENTOR
BEREND DANKER
BY Frank R. Jifani
AGENT United States Patent Office 2,991,359

Patented July 4, 1961

2,991,359

RADIO RECEIVING ARRANGEMENT

Berend Danker, Eindhoven, Netherlands, assignor to North American Philips Company, Inc., New York, N.Y., a corporation of Delaware Filed Sept. 22, 1958, Ser. No. 762,533
Claims priority, application Germany Oct. 16, 1957
3 Claims. (Cl. 250—20)

The invention relates to a radio receiving arrangement having a controllable transistor oscillator- and mixing stage.

In transistor radio receiving arrangements it is common practice to use a transistor as a self-oscillating mixing stage. A transistor arranged in this manner can, however, be used only with difficulty for the simultaneous automatic gain control, in the first place because the control-magnitude concerned affects the input of the oscillator and in the second place because this control, owing to the input-impedance variation of the transistor involved, produces an erroneous adaptation to the input resonant circuit, for example to an aerial circuit.

Owing to these conditions the circuit arrangements known in the valve technique can be transferred to transistors only with difficulty. It is true, with valve arrangements attempts have been made to separate the mixing operation from the oscillation operation by means of an additional rectifier, but this does not permit of obtaining the desired gain control.

The arrangement according to the invention is characterized in that the input oscillation and the oscillation produced by the transistor are fed to a rectifier with a conversion slope controlled by the control-magnitude and in that the intermediate-frequency oscillation thus obtained is amplified in the transistor.

The invention will be described more fully with reference to the drawing.

In the single figure of the drawing, which is a circuit diagram of a portion of a radio receiver according to the invention, a resonant circuit 1 is provided. The incoming radio frequency oscillations, which comprise the signal to be received, are coupled, for example by a winding 10, to a series circuit of capacitor 11, capacitor 12, base to emitter path of transistor 4, capacitor 13, and rectifier or mixer 3. Thus, a portion of the radio frequency oscillations appear across the mixer 3.

The transistor 4 (which may for example be a PNP junction transistor) is caused to oscillate at a predetermined local oscillation frequency by means of collector feedback through a resonant circuit 5. The resonant circuit 5 is coupled to the emitter of transistor 4 by the capacitor 13, and the inductor of the resonant circuit 5 is also connected to the mixer 3, so that a portion of the local oscillations appearing across the resonant circuit 5 also appear across the mixer 3.

The local oscillations and radio frequency oscillations are mixed in the mixer 3, resulting in the production of medium or intermediate frequency oscillations. The intermediate oscillations are developed across the intermediate frequency resonant circuit 6, connected between the junction of capacitors 11 and 12 and ground, and are fed by way of capacitor 12 to the base of the transistor. The amplified medium-frequency oscillation is obtained from the collector resonant circuit 7. For gain control, for example for automatic volume control, a control-voltage, which can be produced by rectification of the medium-frequency oscillations obtained, is fed to the terminal 8 with a polarity opposite that of the rectifier 3 and is rendered operative via the resistor 9 in the circuit of the rectifier 3. The control-voltage produces a variation in the mixing steepness of the rectifying stage 3 and hence a control of the amplitude of the medium-frequency oscillation obtained.

What is claimed is:

1. A radio receiving circuit comprising a transistor, oscillatory circuit means regeneratively connected to said transistor to provide local oscillations, a source of radio frequency oscillations, rectifier means, means applying said local and radio frequency oscillations to said rectifier to provide intermediate frequency oscillations, means applying said intermediate frequency oscillations to said transistor for amplification, a source of gain control voltage, and means applying said control voltage to said rectifier means.

2. A radio receiving circuit comprising a transistor having base, emitter, and collector electrodes, a source of radio frequency oscillations, rectifier means, means serially connecting said source and rectifier means between said base and emitter means, oscillatory circuit means regeneratively connected to said transistor to provide local oscillations, whereby said local and high frequency oscillations are mixed in said rectifier to provide intermediate frequency oscillations, means applying said intermediate frequency oscillations to the base of said transistor, output circuit means connected to said collector electrode for deriving amplified intermediate frequency oscillations, a source of gain control voltage, and means applying said gain control voltage to said rectifier means to control the conversion slope thereof.

3. A radio receiving circuit comprising a transistor having base, emitter and collector electrodes, oscillatory circuit means regeneratively connected between said collector and emitter electrodes to provide local oscillations, a source of radio frequency oscillations, rectifier means, means serially connecting said source and rectifier means between the base and emitter electrodes of said transistor, means applying said local oscillations to said rectifier means whereby said local and radio frequency oscillations are mixed to provide intermediate frequency oscillations in the base-emitter path of said transistor, output circuit means connected to said collector electrode, a source of a gain control voltage, and means applying said gain control voltage to said rectifier means to control the conversion slope thereof.

References Cited in the file of this patent

UNITED STATES PATENTS

| | | |
|---|---|---|
| 2,789,215 | Pan | Apr. 16, 1957 |
| 2,802,100 | Beck et al. | Aug. 6, 1957 |
| 2,853,602 | Farber | Sept. 23, 1958 |